United States Patent [19]
Yamazaki

[11] Patent Number: 5,847,590
[45] Date of Patent: Dec. 8, 1998

[54] DELAY DEVICE AND DELAY TIME MEASUREMENT DEVICE USING A RING OSCILLATOR

[75] Inventor: Hiroshi Yamazaki, Kawasaki, Japan

[73] Assignee: Fujitsu Limited, Kawasaki, Japan

[21] Appl. No.: 868,585

[22] Filed: Jun. 4, 1997

Related U.S. Application Data

[62] Division of Ser. No. 626,957, Apr. 3, 1996.

[30] Foreign Application Priority Data

Jun. 13, 1995 [JP] Japan ..................... 7-146133

[51] Int. Cl.⁶ .................................................. G01R 25/08
[52] U.S. Cl. .............................................. 327/265; 327/3
[58] Field of Search ..................... 327/265, 273, 327/279, 286, 299, 241, 3, 7, 12, 236, 261

[56] References Cited

U.S. PATENT DOCUMENTS

| | | | |
|---|---|---|---|
| 5,134,371 | 7/1992 | Watanabe et al. | 331/65 |
| 5,289,135 | 2/1994 | Hoshino et al. | 327/261 |
| 5,477,196 | 12/1995 | Yamauchi et al. | 327/158 |

Primary Examiner—Timothy P. Callahan
Assistant Examiner—Eunja Shin
Attorney, Agent, or Firm—Staas & Halsey

[57] ABSTRACT

A ring oscillator is an oscillator, which is composed of serially connected buffers, for outputting a plurality of phases, and a last buffer output is inverted and fed back to a first buffer. A decoder selects one of outputs from the ring oscillator according to externally supplied digital data indicating an amount of a delay time to be set. A counter counts an output from the decoder, and outputs a delay signal if a count value reaches a predetermined number. That is, the counter outputs a signal with an amount of delay time according to digital data.

6 Claims, 18 Drawing Sheets

| LOWER 4-BIT DATA | SELECTED PHASE | OUTPUT LOGIC |
|---|---|---|
| 0 | 0 TH PHASE | NON-INVERSION |
| 1 | 1 ST PHASE | NON-INVERSION |
| 2 | 2 ND PHASE | NON-INVERSION |
| 3 | 3 RD PHASE | NON-INVERSION |
| 4 | 4 TH PHASE | NON-INVERSION |
| 5 | 5 TH PHASE | NON-INVERSION |
| 6 | 6 TH PHASE | NON-INVERSION |
| 7 | 7 TH PHASE | NON-INVERSION |
| 8 | 0 TH PHASE | INVERSION |
| 9 | 1 ST PHASE | INVERSION |
| 10 | 2 ND PHASE | INVERSION |
| 11 | 3 RD PHASE | INVERSION |
| 12 | 4 TH PHASE | INVERSION |
| 13 | 5 TH PHASE | INVERSION |
| 14 | 6 TH PHASE | INVERSION |
| 15 | 7 TH PHASE | INVERSION |

FIG. 5

|     | LOWER 4-BIT DATA | SELECTED PHASE | OUTPUT LOGIC |
| --- | --- | --- | --- |
| (1) | 0 | 0 TH PHASE | NON-INVERSION |
| (2) | 1 | 1 ST PHASE | INVERSION |
| (3) | 2 | 2 ND PHASE | NON-INVERSION |
| (4) | 3 | 3 RD PHASE | INVERSION |
|     | 4 | 4 TH PHASE | NON-INVERSION |
|     | 5 | 5 TH PHASE | INVERSION |
|     | 6 | 6 TH PHASE | NON-INVERSION |
|     | 7 | 7 TH PHASE | INVERSION |
|     | 8 | 0 TH PHASE | INVERSION |
|     | 9 | 1 ST PHASE | NON-INVERSION |
|     | 10 | 2 ND PHASE | INVERSION |
|     | 11 | 3 RD PHASE | NON-INVERSION |
|     | 12 | 4 TH PHASE | INVERSION |
|     | 13 | 5 TH PHASE | NON-INVERSION |
|     | 14 | 6 TH PHASE | INVERSION |
|     | 15 | 7 TH PHASE | NON-INVERSION |

FIG. 13

| $D_L[3:0]$ | 0TH PHASE | 1ST PHASE | 2ND PHASE | 3RD PHASE | 4TH PHASE | 5TH PHASE | 6TH PHASE | 7TH PHASE |
|---|---|---|---|---|---|---|---|---|
| 0  | L | H | L | H | L | H | L | H |
| 1  | H | H | L | H | L | H | L | H |
| 2  | H | L | L | H | L | H | L | H |
| 3  | H | L | H | H | L | H | L | H |
| 4  | H | L | H | L | L | H | L | H |
| 5  | H | L | H | L | H | L | L | H |
| 6  | H | L | H | L | H | L | H | L |
| 7  | H | L | H | L | H | L | H | L |
| 8  | L | L | H | L | H | L | H | L |
| 9  | L | H | H | L | H | L | H | L |
| 10 | L | H | L | L | H | L | H | L |
| 11 | L | H | L | H | H | L | H | L |
| 12 | L | H | L | H | L | L | H | L |
| 13 | L | H | L | H | L | H | L | L |
| 14 | L | H | L | H | L | H | L | L |
| 15 | L | H | L | H | L | H | L | L |

FIG. 16

DELAY DEVICE AND DELAY TIME MEASUREMENT DEVICE USING A RING OSCILLATOR

This application is a division of application Ser. No. 08/626,957, filed Apr. 3, 1996, now pending.

BACKGROUND OF THE INVENTION

1. Field of the Invention

The present invention relates to a delay device and a delay time measurement device, each of which employs a ring oscillator, and further relates to an exclusive-OR circuit for use in the delay device.

2. Description of the Related Art

For improved operating rates of components such as an LSI, etc., a delay circuit for dynamically adjusting a phase lag between an internal clock signal of the LSI and an external clock signal is required. To match the timings of the internal clock signal and the external clock signal more precisely, a minimum step of delay that the delay circuit can generate must be improved.

FIG. 1 shows a structure of a conventional delay circuit. This delay circuit comprises a plurality of serially connected buffers 11, and a selector 12 for selecting and outputting one of signals output from the plurality of buffers 11. The selector 12, which is supplied with a delay predetermining digital value for predetermining an amount of delay time from an input signal, outputs a signal according to the delay predetermining digital value. As a result, the selector 12 outputs the signal with a delay time of a predetermined digital value.

Additionally, the above described delay circuit employs an exclusive-OR circuit shown in FIG. 2, to output an inverted signal and a non-inverted signal of an input signal.

In this exclusive-OR circuit, the input signal is input to one of the control terminals of transfer gates 23 and 24 unchanged, and it is input to the other of the control terminals via an inverter 21. In addition, an inversion control signal is input to the transfer gate 23, and a signal generated by inverting the inversion control signal by the inverter 22 is input to the transfer gate 24.

To make the minimum step of delay smaller without affecting the maximum delay in the above described conventional delay circuit, it is required to reduce the amount of delay of one buffer, and to increase the number of serially connected buffers, which leads to a larger scale of buffer circuitry. As the number of buffers increases, the scale of the selector circuitry becomes larger. As a result, the scale of the whole delay circuit also becomes larger.

For the above described exclusive-OR circuit, there is a difference between the load when outputting an input signal with inversion and when outputting the input signal without inversion, as viewed from the side of outputting an inversion control signal. Accordingly, the amount of delay time may vary depending on whether or not to invert the input signal to be output.

SUMMARY OF THE INVENTION

The object of the present invention is to provide a delay circuit for generating a large amount of delay time for an input signal, and an enhanced minimum step of delay, without increasing the scale of the circuit. The second object of the present invention is to provide a delay time measurement device for measuring an amount of delay time between two signals as digital data.

The delay device according to the present invention comprises a ring oscillator for outputting a plurality of phases, a decoder for decoding an output from the ring oscillator, and a counter for counting an output from the decoder and outputting a delay signal when a count value reaches a predetermined value. Since this delay device outputs the delay signal when the amount of delay time the ring oscillator generates reaches the predetermined value, it can generate a delay signal with a desired amount of delay time by setting the counter to a desired value.

In the meantime, the delay time measurement device according to the present invention comprises a ring oscillator for outputting a plurality of phases, an encoder for latching the plurality of phases output from the ring oscillator and encoding latched signals, and a counter for counting one of the plurality of phases output from the ring oscillator. The delay time measurement device causes the ring oscillator to start oscillating in synchronization with a first signal, and makes the encoder latch the outputs from the ring oscillator in synchronization with a second signal. Thus, the delay time measurement device can obtain the delay time between the first and the second signals according to the amount of delay time of the ring oscillator latched by the encoder, and the amount of delay time corresponding to the number of oscillation cycles of the ring oscillator that the counter counts up.

BRIEF DESCRIPTION OF DRAWINGS

FIG. 5 shows a table of correspondence between lower 4-bit data, phases selected by a decoder, and output logics;

FIG. 13 shows a table of correspondence between lower 4-bit data, phases selected by the decoder, and output logics according to the second embodiment;

FIG. 16 shows a logic table of an encoder according to the third embodiment;

DESCRIPTION OF THE PREFERRED EMBODIMENT

First of all, explanations about the principles of the delay device, the delay time measurement device, and the exclusive-OR circuit are provided. The delay device according to the present invention comprises a ring oscillator for outputting a plurality of phases, a decoder for decoding an output from the ring oscillator, and a counter for counting an output from the decoder, and outputting a delay signal when a count value reaches a predetermined value.

Figure 3:
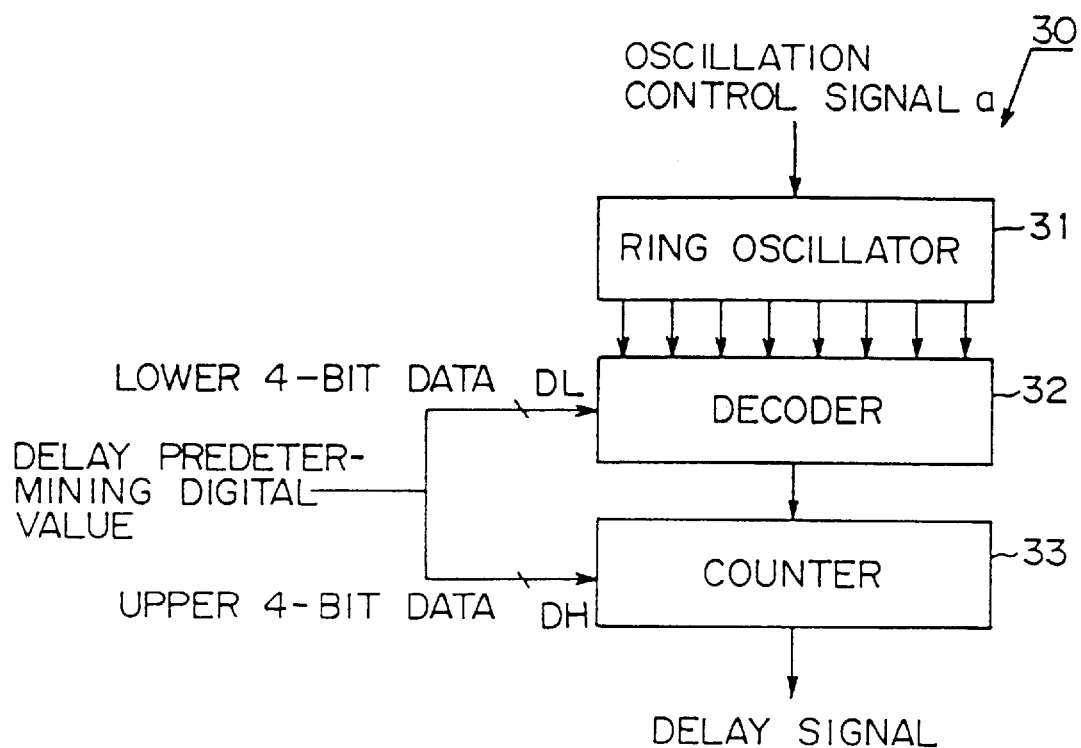
FIG. 3 is a block diagram showing a circuit of a delay device according to the first embodiment.

The delay device 30, for example, comprises a ring oscillator 31 for outputting "Mr" phases, a decoder 32 for decoding the outputs of the "Mr" phases, and a counter 33 for counting an output from the decoder 32, as shown in FIG. 3.

The delay time measurement device according to the present invention, which is intended to measure an amount of delay time between a first signal and a second signal, comprises a ring oscillator starting its oscillation with the first signal, an encoder for latching an output from the ring oscillator in synchronization with the second signal and encoding the latched signal, and a counter for counting one of the outputs from the ring oscillator.

Figure 18:
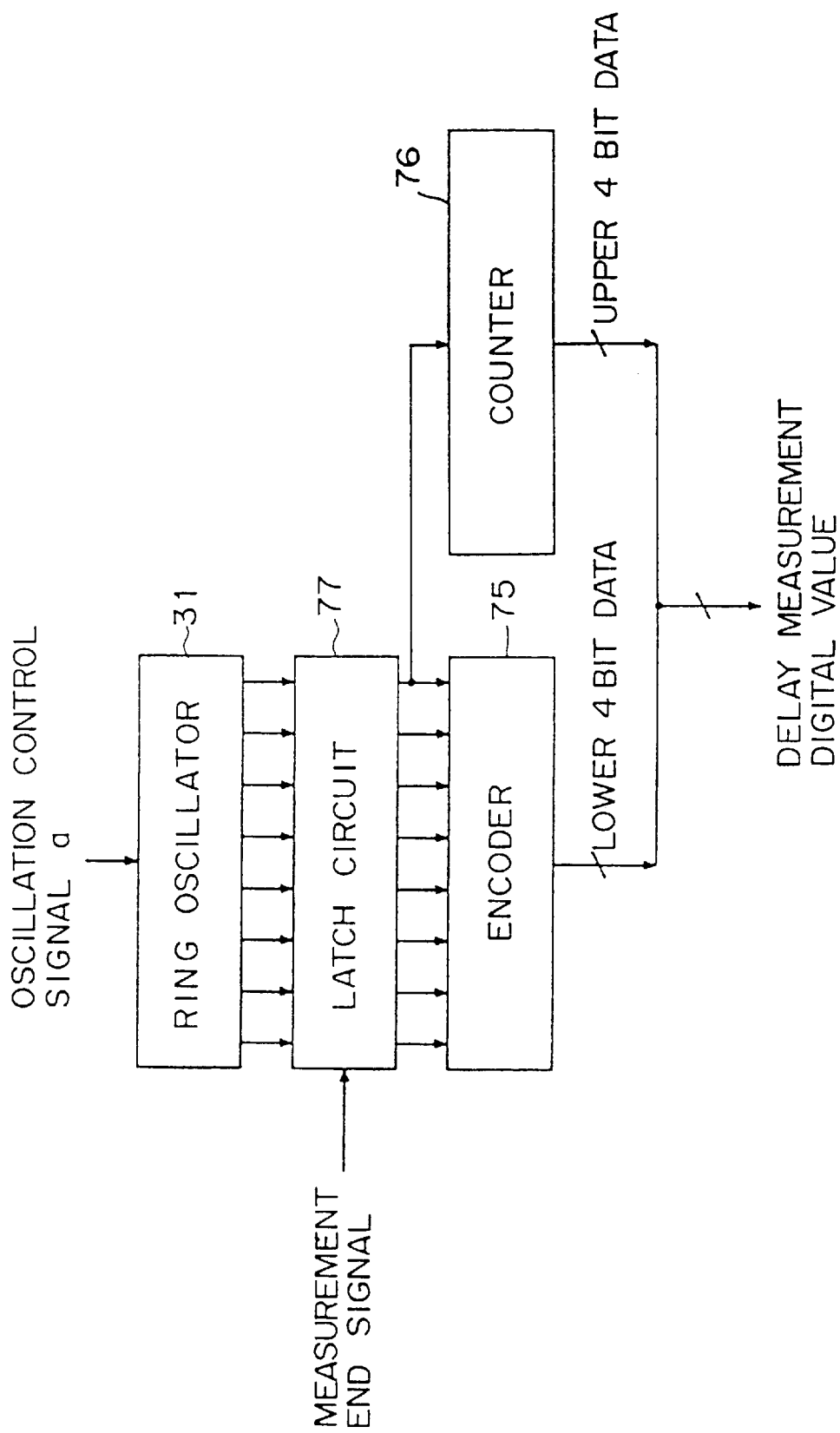
FIG. 18 is a block diagram showing a delay time measurement device according to the fourth embodiment.

The delay time measurement device, for example, comprises a ring oscillator 31 for outputting "Mr" phases, which starts its oscillation with an oscillation control signal (the first signal), a latch circuit 77 for latching the "Mr" phases in synchronization with a measurement end signal (the second signal), and an encoder 75 for encoding an output from the latch circuit 77 and outputting the encoded data as lower 4-bit data of the amount of delay time between the first signal and the second signal, and a counter 76 for counting one of the outputs from the latch circuit 77 and outputting the count value as upper 4-bit data of the amount of delay time between the first signal and the second signal, as shown in FIG. 18.

An exclusive-OR circuit according to the present invention is employed in the delay device for outputting a signal delayed from an input signal, and a two-input selector for supplying an input signal to a control terminal as a control signal for determining which of two inversion control signals respectively is input to two input terminals. To one of the two input terminals, the inversion control signal for determining whether to invert a signal to be output is input via an odd number of inverters, while to the other of the two input terminals, the inversion control signal is input via an even number of serially connected inverters.

The delay device according to the present invention can generate an arbitrary amount of delay time without increasing the scale of the circuit of the delay device, by generating a delay of an integer multiple of one stage of the ring oscillator in the decoder, and generating a delay of an integer multiple of an oscillation cycle output from the ring oscillator in the counter.

By way of example, assume that the ring oscillator 31 shown in FIG. 3 outputs phases numbered from 0 to 7 (Mr=8), and the logic is inverted, not in each stage of the ring oscillator, but only in the course from the last phase to the first phase. Also assume that lower 4-bit data DL ($0 \leq DL \leq 2Mr-1$) included in a delay predetermining digital value D is supplied to the decoder 32, an upper 4-bit data DH is supplied to the counter 33.

In this case, the 0th phase output from the ring oscillator 31 is driven HIGH with a delay time of "t r0" (including the delay time of one buffer) from a rising edge of an oscillation control signal "a", and the 1st phase is driven HIGH with a delay time of "t d1" (the delay time of one buffer). After that, the subsequent phases from the 2nd to 7th are driven HIGH respectively with the delay time of "t d1". The decoder 32 selects and outputs one of the outputs from the ring oscillator 31 according to the predetermined lower 4-bit data DL. The counter 33 counts one of the outputs from the ring oscillator 31 and outputs a delay signal when the count value reaches a predetermined number of times "nc" (the value predetermined by the upper 4-bit data DH).

A total amount of delay time "t total" from the rising edge of the first signal (oscillation control signal) till the rising edge of the output signal from the counter 33 is obtained by the following equation:

$$\begin{aligned} t\,\text{total} &= t\,r0 + t\,\text{decode} + DL\,t\,d1 + \\ &\quad nc(2Mr\,t\,d1) + t\,\text{counter} \\ &= t\,r0 + t\,\text{decode} + t\,\text{counter} + \\ &\quad (nc(2Mr) + DL)\,t\,d1 \end{aligned} \quad (1)$$

where "t r0" is the delay time from the rising edge or a falling edge of the oscillation control signal till the rising edge of the 0th phase, "t decode" is the delay time produced within the decoder 32, and "t counter" is the delay time of an "nc"th input-to-output transition. Since "nc" is a value predetermined by the upper 4-bit data DH included in the delay predetermining digital value, the above described equation (1) can be determined by the lower 4-bit data DL where the decoder 32 sets the total amount of delay time "t total" the delay device generates, and the upper 4-bit data DH the counter 33 predetermines.

Furthermore, assuming that the amounts of delay time of the decoder 32 and the counter 33, "t decode" and "t counter" respectively, are adjusted as follows:

$$t\,r0 + t\,\text{decode} + t\,\text{counter} = 2k\,Mr\,t\,d1 \quad (2)$$

and define "nc" as follows:

$$nc = DH - k \quad (k: \text{integer}) \quad (3)$$

The above described equation (1) results in:

$$\begin{aligned} t\,\text{total} &= 2\,k\,Mr\,t\,d1 + ((DH-k)(2\,Mr) + DL)\,t\,d1 \quad (4) \\ &= (DH\,(2Mr) + DL)\,t\,d1 \\ &= D \cdot t\,d1 \end{aligned}$$

where $$D = DH\,(2Mr) + DL$$

According to the above equation, the total amount of delay time "t total" in proportion to the delay predetermining digital value "D", can be obtained in a range of $2k\,Mr \leq D < 2Mc\,Mr$ (where Mc is the maximum value of the counter 33). In this case, the minimum step of delay the delay device can generate is equivalent to the amount of delay time "t d1" of one stage of the ring oscillator 31, and the maximum delay is obtained by (2Mc Mr-1) t d1, which depends on the frequency of the ring oscillator 31.

As described above, the amount of delay time can be improved without increasing the scale of the circuit of the delay device, by generating a signal with the amount of delay time equivalent to an integer multiple of the delay time in one stage of the ring oscillator 31, and equivalent to an integer multiple of one cycle (2Mr t d1) of the ring oscillator 31, using the decoder 32 and the counter 33. To double the maximum delay, the scale of the circuit must be doubled or more according to the conventional techniques, while it is only required to double the number of phases "Mr" of the ring oscillator 31, or the maximum value "Mc" of the counter 33, according to the present invention. At this time, the increase of the scale of the circuit is slight. To double the maximum value of the counter 33, for example, only arranging one additional flip-flop and a few additional logic gates is sufficient.

The present invention is most suitable for a phasing circuit such as a delay circuit, a clock, etc. mounted in an LSI component, etc. Since a large amount of delay time can be realized without increasing the scale of the circuit, the minimum step of delay the delay circuit generates can be improved by reducing the amount of delay time in one stage of the ring oscillator.

The delay time measurement device measures an amount of delay time between the first signal and the second signal as a digital value, by obtaining how many stages of the delay time of the ring oscillator, a duration from a transition of the first signal till a transition of the second signal, corresponds to by the encoder, and obtaining how many cycles of the delay time of the ring oscillator the duration from the transition of the first signal till the transition of the second signal corresponds to by the counter.

For example, the counter 76 shown in FIG. 18 indicates the number of oscillation cycles output from the ring oscillator 31 corresponding to a duration from a transition of the first signal (oscillation control signal) till the transition of the second signal (measurement end signal), and the output from the encoder 75 indicates the number of stages corresponding to the amount of delay time. That is, by taking advantage of a delay circuit simply composed of a ring oscillator, etc., the amount of delay time between two types of signals can be obtained as digital delay time data.

In the exclusive-OR circuit according to the present invention, by connecting an even number of inverters to one of the input terminals of a two-input selector, and connecting an odd number of inverters to the other of the input terminals of the two-input selector, the amounts of delay time when outputting the input signal with/without inversion, can be made equal.

FIG. 3 is a block diagram showing the delay circuit 30 according to the first embodiment of the present invention. This embodiment is a case where each of phases output from the ring oscillator 31 is in phase.

The ring oscillator 31 is an oscillator for outputting a plurality of phases, composed of serially connected buffers, each of which consists of two inverters. The output from the last buffer is inverted and fed back to the first buffer. This ring oscillator 31 starts oscillating if the input signal (oscillation control signal "a"), which is a base of generating a desired amount of delay time, goes HIGH.

The decoder 32 selects one of the outputs from the ring oscillator 31 according to the externally supplied lower 4-bit data DL 3:0 included in the 8-bit delay predetermining digital value D 7:0. The counter 33 counts an output signal from the decoder 32, and outputs a delay signal when the count value matches a predetermined number of times "nc" (the number of times predetermined by the upper 4-bit data DH 4:7 included in the digital value D 7:0). Data fed to the decoder 32 and the counter 33 for predetermining the amount of delay time is not limited to the above described upper 4-bit and lower 4-bit data of the 8-bit digital value. Two digital values (a first digital data and a second digital data) may be used.

Figure 4:
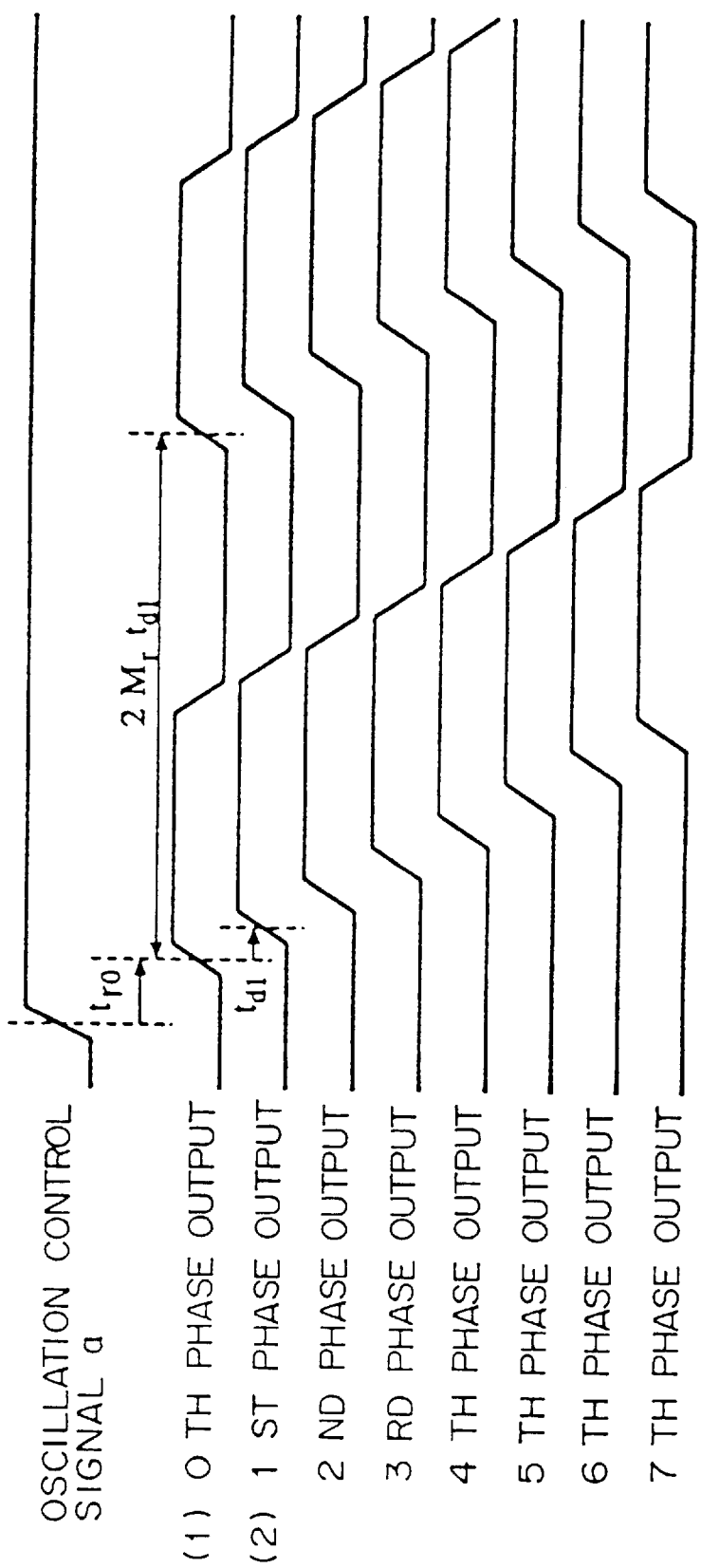
FIG. 4 shows an output timing chart of a ring oscillator according to the first embodiment.

FIG. 4 shows an output timing chart of the ring oscillator 31 according to the first embodiment. Since each of the outputs are in-phase in this embodiment, the 0th phase output goes to "1" with the amount of delay time "t r0" (including the amount of delay time "t d1" of one stage of the ring oscillator 31), after the oscillation control signal "a" goes to "1", shown in FIG. 4(1). As shown in FIG. 4(2), the 1st phase output then goes to "1" with the amount of delay time "t d1". Subsequently and similarly, a phase output in a next stage makes a transition with the amount of delay time "t d1" from the transition of the phase output in the preceding stage.

Figure 6:
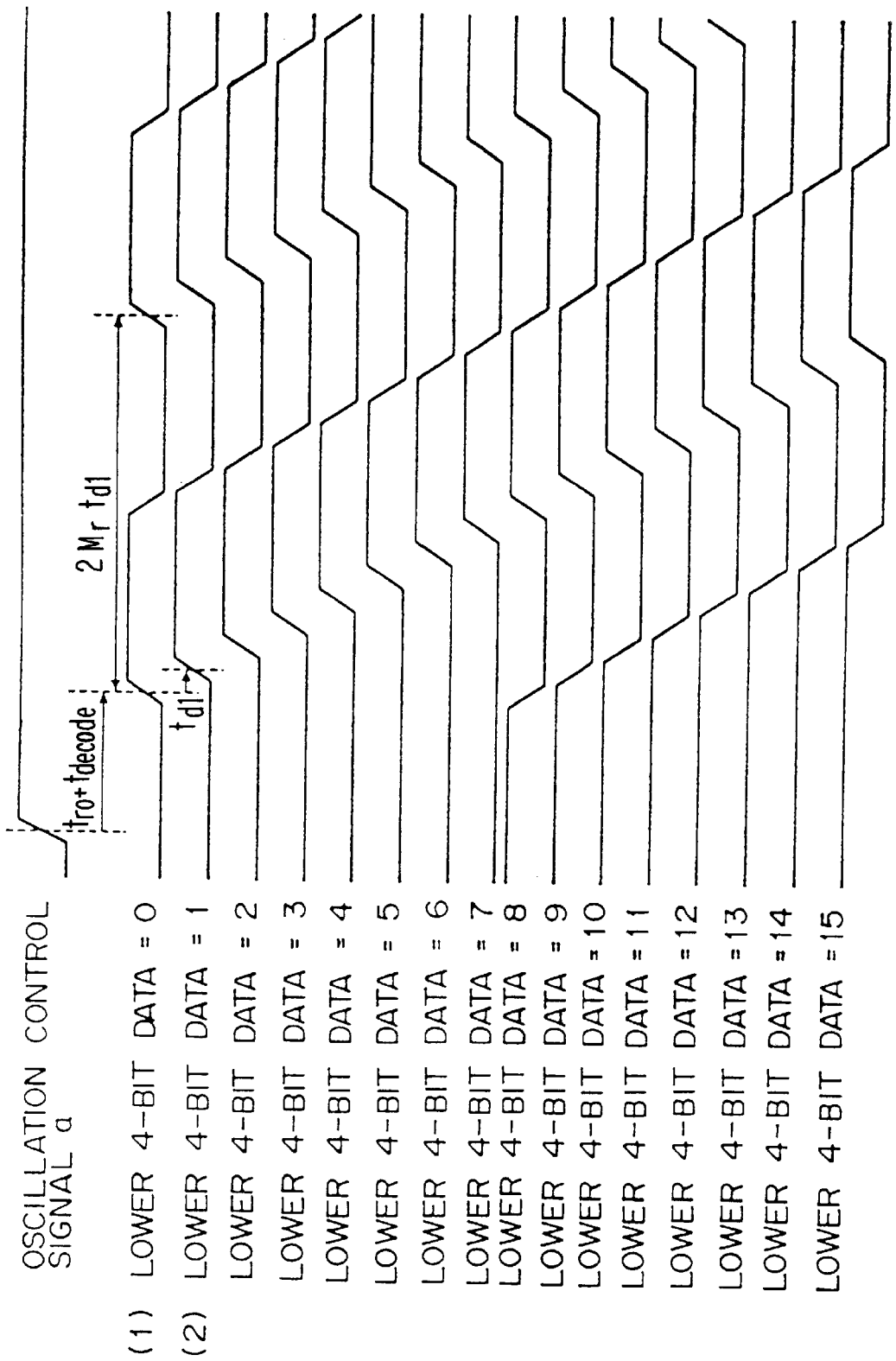
FIG. 6 shows an output timing chart of the decoder according to the first embodiment.

Next, FIG. 5 shows a table of correspondence between a phase and an output logic of the ring oscillator 31 selected by the decoder 32, according to lower 4-bit data DL set in the decoder 32. FIG. 6 shows an output timing chart of the decoder 32.

If the value "0" is assigned as the lower 4-bit data DL, the decoder 32 selects the 0th phase output of the ring oscillator 31, and outputs the selected signal without inversion, as shown in FIG. 5. As a result, the decoder 32 outputs a signal with the amount of delay time "t decode" produced within the decoder 32, in addition to the amount of delay time "t r0" including the delay time of "t d1" in one stage of the ring oscillator 31, from the rising edge of the oscillation control signal "a", as shown in FIG. 6(1).

If the value "1" is assigned as the lower 4-bit data DL, the decoder 32 selects the 1st phase output of the ring oscillator 31, and outputs the selected signal without inversion, as shown in FIG. 5. As a result, the decoder 32 outputs a signal delayed from the output signal of the decoder 32 when the 0th phase is selected, by the delay time of "t d1" produced in one stage of the ring oscillator 31, as shown in FIG. 6(2).

As described above, assigning arbitrary lower 4-bit data DL to the decoder 32 enables an output of the signal with the amount of delay time corresponding to the number of stages of the ring oscillator 31, which is predetermined by the lower 4-bit data DL.

The counter 33 counts an output from the decoder 32, and outputs the delay signal when the count value matches the number of times "nc" predetermined by the upper 4-bit data DH.

That is, the decoder 32 generates the amount of delay time corresponding to the predetermined lower data DL in a range of the amount of delay "2 Mr t d1" produced in one cycle of the ring oscillator 31 ("Mr" is the number of phases output from the ring oscillator 31: Mr=8 in this embodiment). Then, the counter 33 counts the number of rising edges output from the decoder 32, and outputs a delay signal when the count value matches the number of times "nc" predetermined by the upper data DH, including the predetermined value, thereby allowing the output of the signal with the amount of delay time corresponding to the predetermined digital value D (DH and DL).

Provided below is the explanation about the second embodiment according to the present invention, where a logic inversion is performed in each stage of the ring oscillator 31.

Figure 7:
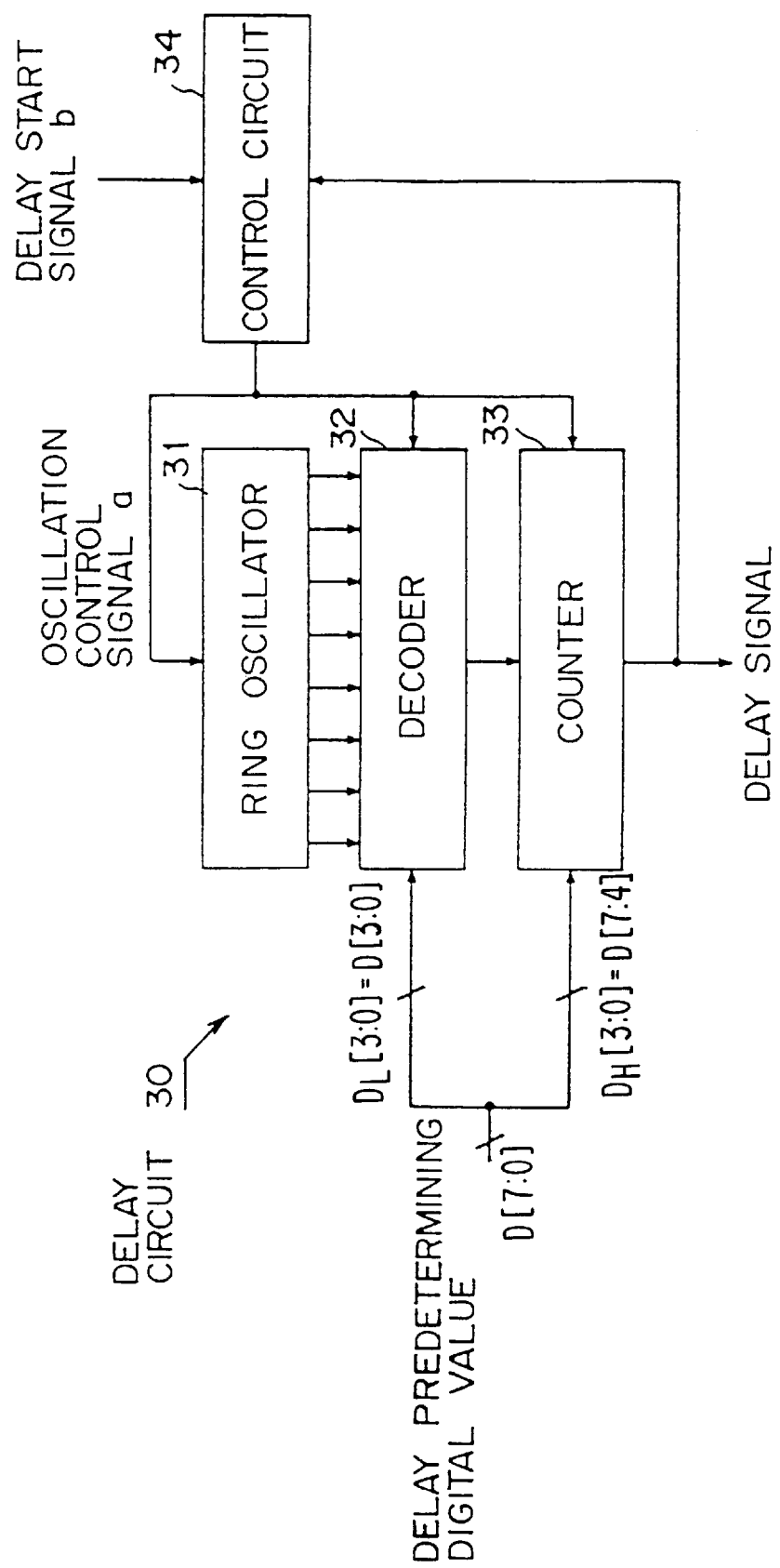
FIG. 7 is a block diagram showing a circuit of a delay device according to the second embodiment.

FIG. 7 is a block diagram showing the delay circuit 30 according to the second embodiment. In this embodiment, each stage of the ring oscillator 31 is composed of inverters in order to improve the minimum step of delay that the delay circuit can generate. As a result, each of the phase outputs is different in the ring oscillator 31. The decoder outputs the output from the ring oscillator 31 with/without inversion.

A control circuit 34 drives the oscillation control signal "a" LOW if the input signal (delay start signal "b"), which is a base of the delay time to be predetermined, is LOW ("0"). It also drives the oscillation control signal "a" HIGH ("1") at the time of detecting a rising edge of the oscillation start signal "b", and drives the oscillation control signal "a" LOW ("0") at the time of detecting a rising edge of the delay signal output from the counter 33. The control circuit 34 controls latching of the lower 4-bit data DL by the decoder 32 and reading the upper 4-bit data DH by the counter 33, by outputting the oscillation control signal "a" to the decoder 32 and the counter 33.

The decoder 32, which is supplied with the lower 4-bit data DL0 through DL3 (DL 3:0) included in the delay predetermining digital value of 8 bits, decodes an output signal from the ring oscillator according to the lower 4-bit data DL, and outputs a signal with the amount of delay time corresponding to the lower 4-bit data DL0 through DL3. That is, supplying arbitrary 4-bit data to the decoder 32 enables an output of a signal with a desired amount of delay time within a delay range of one cycle of the ring oscillator 31.

The counter 33, which is supplied with the upper 4-bit data DH0 to DH3 included in the above described 8-bit digital value, counts an output from the decoder 32, and outputs a delay signal when the count value matches the number of times "nc" predetermined by the upper 4-bit data DH. That is, supplying arbitrary 4-bit data to the counter 33 enables an output of a signal with the amount of delay time corresponding to an integer multiple of one cycle delay of the ring oscillator.

Figure 8:
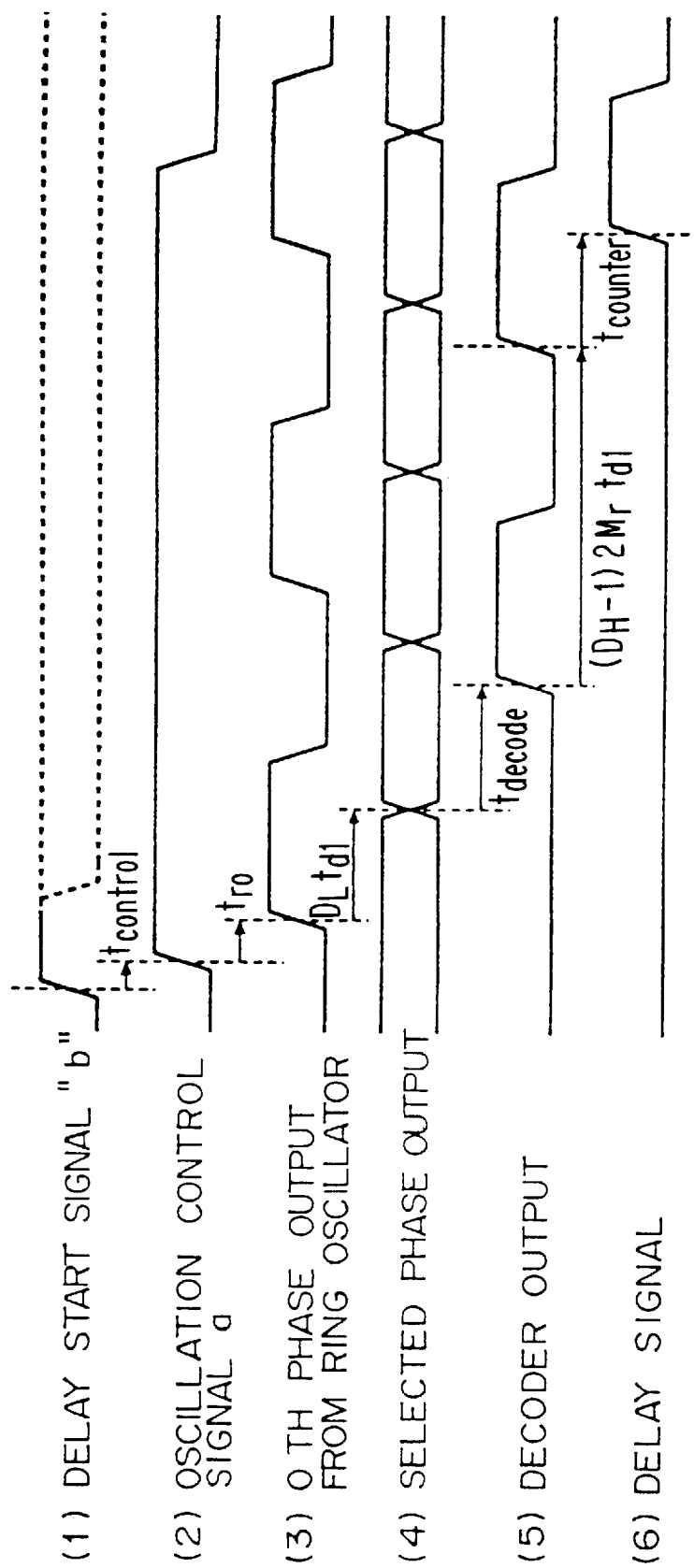
FIG. 8 shows a timing chart of the delay device according to the second embodiment.

The operations performed by the delay circuit 30 shown in FIG. 7 are explained below, by referring to the timing chart shown in FIG. 8. If the delay start signal "b", which is a base for generating a desired amount of delay time goes to "1" (FIG. 8(1)), the control circuit 34 outputs the oscillation control signal "a" with the amount of delay time "t control" (the amount of delay time from the rising of the delay start signal "b" till the rising of the oscillation control signal "a" within the control circuit 34) (as shown in FIG. 8(2)). If the oscillation control signal "a" is driven to "1", the 0th phase output from the ring oscillator 31 is driven to "1" with the amount of delay time "t r0" from the rising edge of the oscillation control signal "a" (as shown in FIG. 8(3)).

The phase output from the ring oscillator 31 with the amount of delay time "DL t d1" (t d1: delay time of one inverter of the ring oscillator 31) predetermined by the lower 4-bit data DL, is driven to "1" or "0" (as shown in FIG. 8(4)), the output from the decoder 32 is driven to "1" with the amount of delay time "t decode" (as shown in FIG. 8(5)). "t decode" is an amount of delay time from the transition of a phase output from the ring oscillator 31 according to the lower 4-bit data DL till the rising edge of the output from the decoder 32.

The counter 33 counts the number of the rising edges of the signals output from the decoder 32. When the count value matches the number of times "nc" predetermined by the upper 4-bit data DH (if a time of "2(DH-1) Mr Td1" elapses), the signal output from the counter is driven to "1" with an amount of delay time "t counter" (FIG. 8(6)). "t counter" is an amount of delay time within the counter 33 from when the number of the rising edges of the signals output from the decoder 32 matches the predetermined number of times "nc" till when the output from the counter 33 actually changes from 0 to 1.

If the rising edge of the delay signal is detected by the control circuit 34, the oscillation control signal "a" is driven to "0", and the oscillation operations of the ring oscillator 31 are aborted.

Assuming a total amount of delay time from when the delay start signal "b" goes to "1" till when the counter 32 outputs the delay signal is defined as "t total", "t total" is obtained by the following equation.

$$t\text{ total} = t\text{ control} + t\text{ r0} + t\text{ decode} + t\text{ counter} + 2(DH-1)Mr\, t\, d1 + DL\, t\, d1 \quad (5)$$

By adjusting the amounts of delay time of the control circuit 34, the decoder 32, and the counter 33, the following equation is obtained:

$$t\text{ control} + t\text{ decode} + t\text{ counter} = 2\, Mr\, t\, d1 - t\, r0$$

As a result, the total amount of delay time produced in the control circuit 34 should be:

$$t\text{ total} = (2DH\, Mr + DL)\, t\, d1 = D\, t\, d1 \quad (6)$$

That is, if the amount of delay time of one stage of the ring oscillator 31 is "t d1", and one cycle of the ring oscillator 31 is "2 Mr t d1", the amount of delay time corresponding to the number of stages of the ring oscillator 31 according to the lower 4-bit data DL, and the amount of delay time corresponding to an integer multiple of one cycle of the ring oscillator 31 according to the upper 4-bit data DH, can be generated by assigning the lower 4-bit data DL of the delay predetermining digital data D corresponding to a desired amount of delay time to the decoder 31, and assigning the upper 4-bit data DH to the counter 33.

In this embodiment, by assigning desired upper 4-bit data DH and lower 4-bit data DL of the digital data D to the counter 33 and the decoder 32, respectively, the total amount of delay time "t total" can be obtained according to that digital data D. Therefore, even if a large amount of delay time is required, there is no need to arrange buffers and inverters corresponding to the amount of delay time, thereby simplifying a configuration of the delay circuit.

Provided below are the explanations about examples of the above described ring oscillator 31, the decoder 32, and the control circuit 34.

Figure 9:
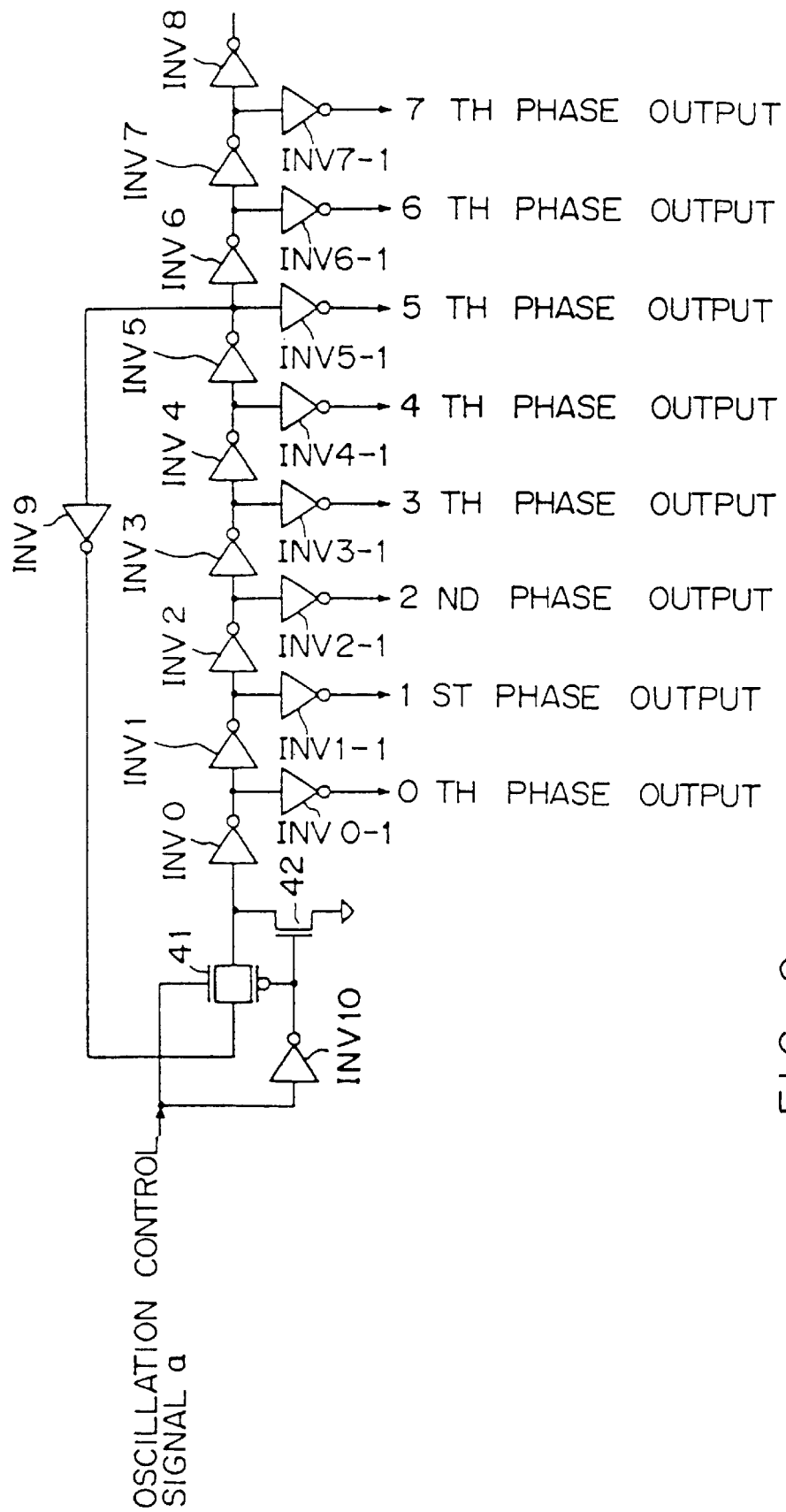
FIG. 9 shows an example of a ring oscillator according to the second embodiment.

FIG. 9 shows an example of the ring oscillator 31 according to the second embodiment. In this embodiment, the ring oscillator 31 can output a signal with a delay generated by each of inverters from the 0th phase to the 7th phase. The ring oscillator 31 performs an oscillation operation if the oscillation control signal "a" is "1". If the oscillation control signal "a" is "0", even-numbered phases are output as "0", and odd-numbered phases are output as "1".

8 inverters INV 0 to INV 7 are serially connected to an output of a transfer gate 41 to which the oscillation control signal "a" is input. Outputs of the inverters INV 0 through INV 7 are respectively connected to inverters INV 0-1 to INV 7-1 for outputting the 0th phase to the 7th phase. Note that the output of the 8th inverter INV 7 is connected with the inverter INV 8 in order to impose the same load as that of the other inverters on INV 7.

Additionally, the output of the 6th inverter INV 5 is connected to the inverter INV 9, whose output is connected to the input of the transfer gate 41. Thus, the signal generated by inverting the output of the inverter INV 5 by INV 9 is fed back to the input of the transfer gate 41.

To the output of the transfer gate 41, a transistor 42 is connected. If the oscillation control signal is LOW, it is inverted by the inverter INV 10 and fed to the gate of the transistor 42, which leads to switching on the transistor 42. Thus, a signal at the low level is fed as an input signal to the inverter INV 0.

Provided below is the explanation about the operations performed by the ring oscillator 31 shown in FIG. 9, referring to the timing chart shown in FIG. 10.

Figure 10:
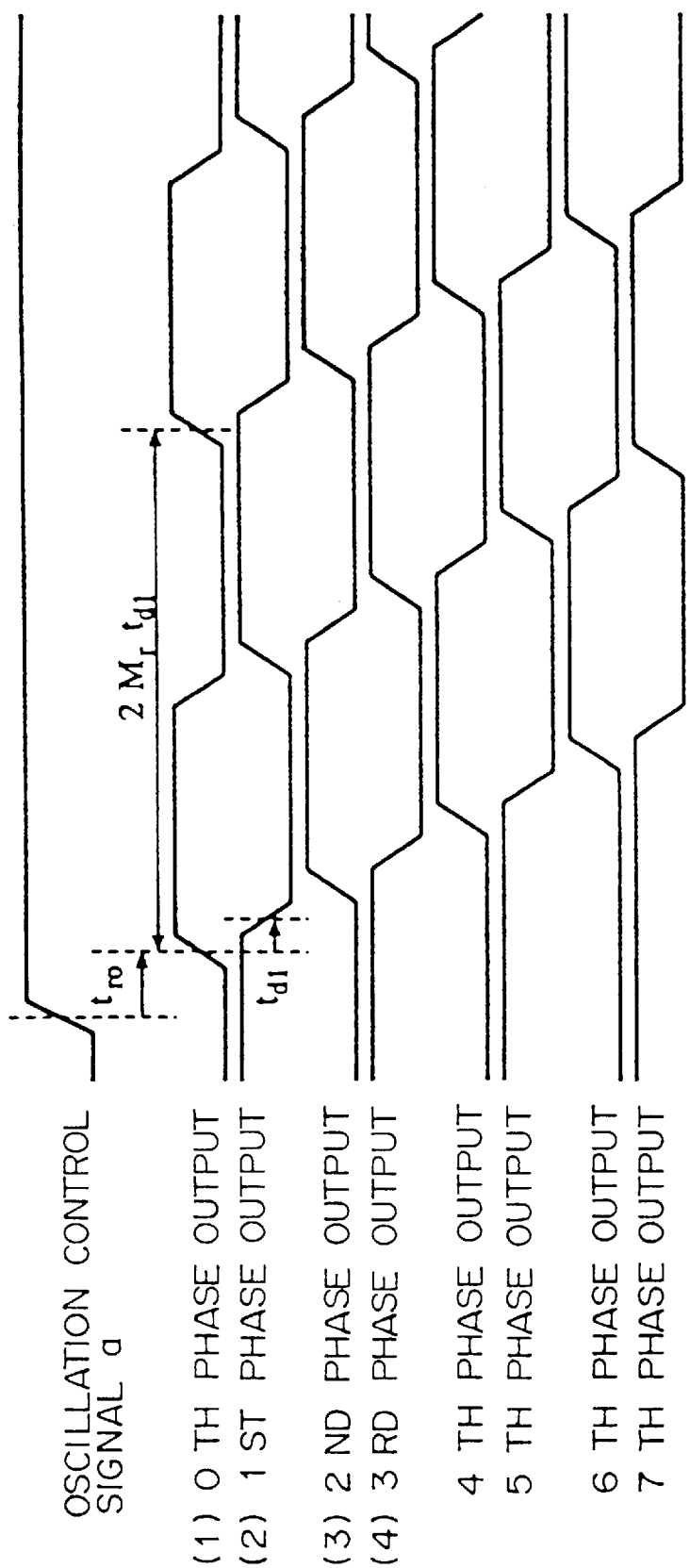
FIG. 10 shows an output timing chart of the ring oscillator according to the second embodiment.

If the delay start signal "b" changes to "1", and the oscillation control signal "a" is driven to "1", the output of the 0th inverter INV 0 makes a "1-to-0" transition, which is further inverted by the INV 0-1 which outputs "1" as the 0th phase (as shown in FIG. 10(1)). Note that the 0th phase output results in a signal delayed from the oscillation control signal "a" by the delay time of "t r0".

If the output of the 0th inverter makes a "1-to-0" transition, the output of the next inverter INV 1 changes from "0" to "1". Then, the output of the inverter INV 1 is inverted by the inverter INV 1-1, and "0" is output as the 1st phase. (as shown in FIG. 10(2)). The 1st phase output results in a signal delayed from the 0th phase output by the delay time of "t d1".

Similarly, the 2nd phase output results in a signal of an inverted phase delayed from the 1st phase output by the delay time of "t d1" (FIG. 10(3)), the 3rd phase output results in the signal of an inverted phase delayed from the 2nd phase output by the delay time of "t d1" (FIG. 10(4)), and the subsequent phase outputs from the 4th to 7th result in signals of inverted phases, respectively delayed from the preceding phase by the delay time of "t d1".

Figure 11:
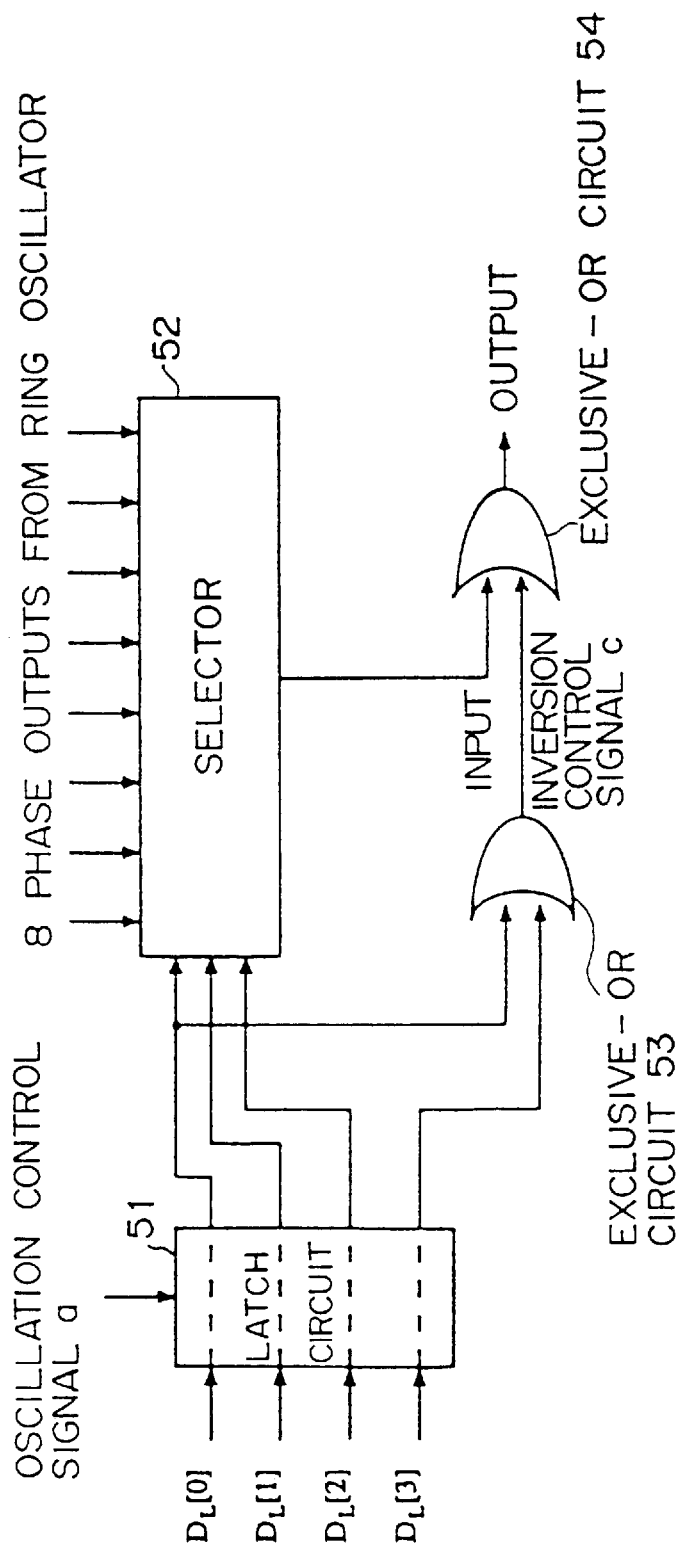
FIG. 11 is a block diagram showing a circuit of a decoder according to the second embodiment.

FIG. 11 is a block diagram showing the circuitry of the decoder 32. In this figure, a latch circuit 51 latches the lower 4-bit data DL0–DL3 included in the delay predetermining digital value, in synchronization with a rising edge of the oscillation control signal "a". It outputs the latched 0th bit DL0 and 3rd bit DL3 to an exclusive-OR circuit 53, and at the same time, outputs the latched data from the 0th bit DL0 through the 2nd bit DL2 to a control terminal of a selector 52.

The exclusive-OR circuit 53 performs an exclusive-OR operation on the 0th bit data DL0 and the 3rd bit data DL3 included in the lower 4-bit data output from the latch circuit 51, and outputs the resultant value to the exclusive-OR circuit 54 as an inversion control signal "e".

The signal selected by the selector 52 is output to one of the input terminals of the exclusive-OR circuit 54. To the other input terminal of the exclusive OR circuit 54, the inversion control signal "e" output from the exclusive-OR circuit 53 is input. The exclusive-OR circuit 54 outputs the output signal from the selector 52 with/without inversion, according to the inversion control signal "e".

Since the ring oscillator 31 is composed of serially connected inverters in this embodiment, each of the phase outputs is an inversion of the preceding phase output. Therefore, the decoder 32 outputs each of the phase outputs from the ring oscillator 31 with/without inversion, thereby making each of the phase outputs equal.

Figure 1:
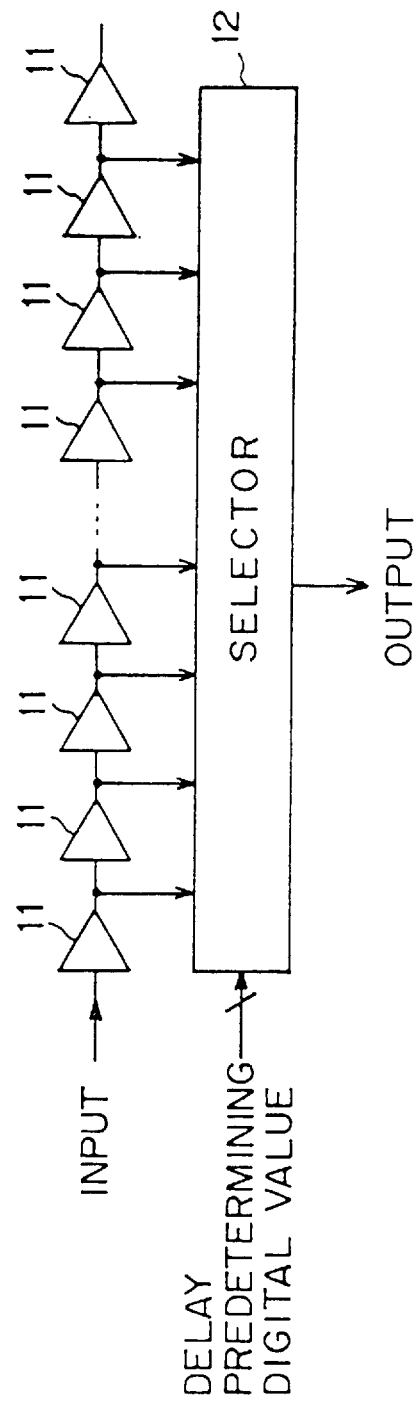
FIG. 1 shows a structure of a conventional delay circuit.
Figure 2:
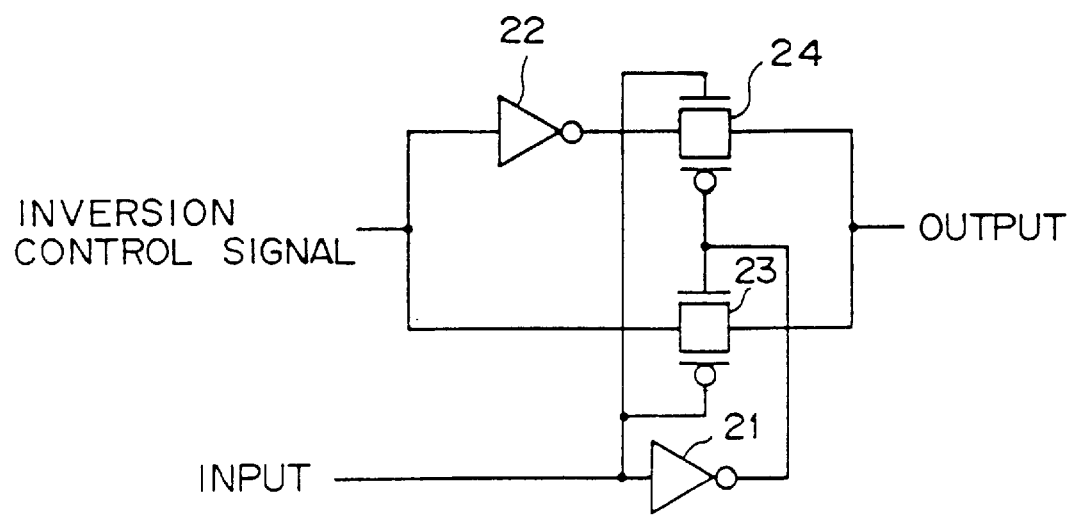
FIG. 2 shows a structure of a conventional exclusive-OR circuit.

If the conventional exclusive-OR circuit shown in FIG. 2 is employed as the exclusive-OR circuit 54 shown in FIG. 11, the load when outputting the input signal without inversion may differ from that of outputting the input signal with inversion, and the amounts of delay time may differ, as viewed from the circuit outputting the inversion control signal "e".

Figure 12:
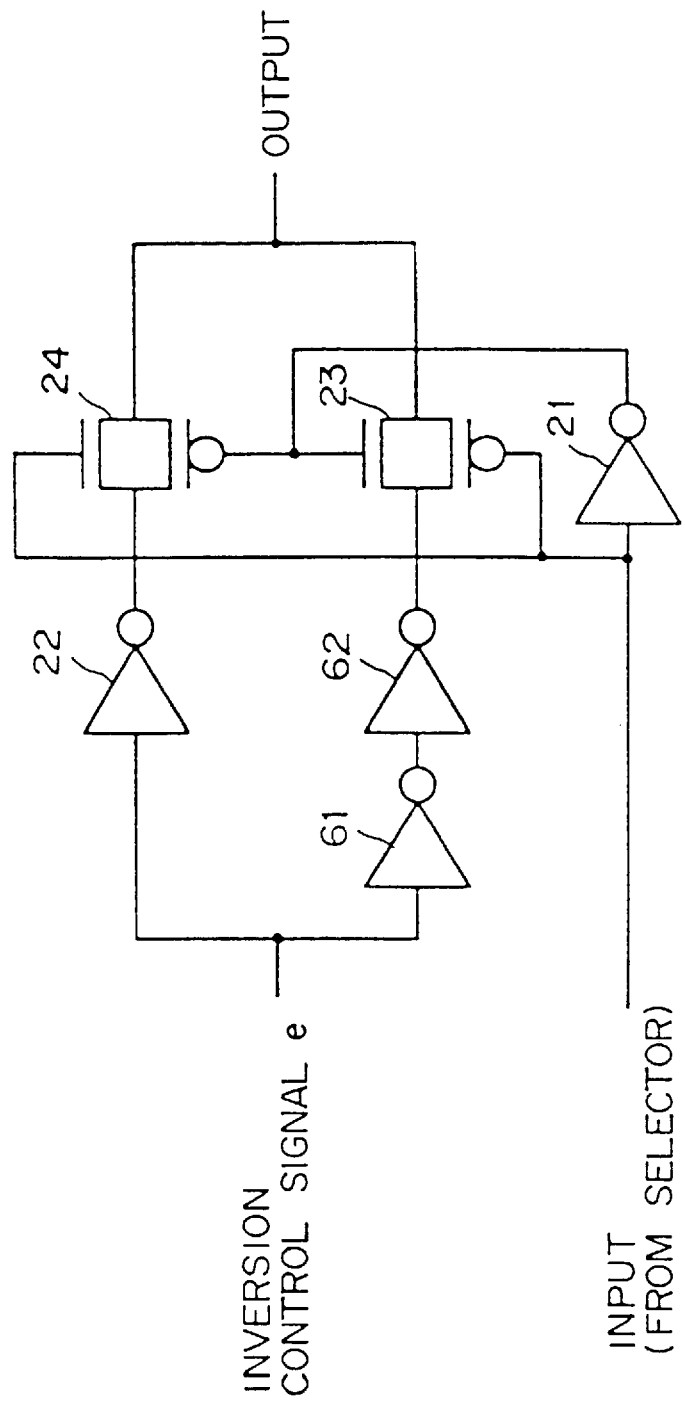
FIG. 12 shows a structure of an exclusive-OR circuit according to the second embodiment.

To equalize the amounts of delay time when outputting the input signal regardless of inversion, two inverters 61 and 62 are serially connected to the input of the transfer gate 23 to which the inversion control signal "e" is conventionally input unchanged, according to the present invention, as shown in FIG. 12. As a result, the load as viewed from the circuit outputting the inversion control signal "e" is made equal.

Thus, the load of outputting the input signal with/without inversion does not depend on an external circuit external circuit, so that the amount of delay time in the exclusive-OR circuit 54 can be fixed. In this case, serially connecting the two inverters to the transfer gate 23 eliminates a difference of the delay time between when the signal is inverted and when the signal is not inverted.

Provided below is the explanation about the correspondence between the lower 4-bit data DL assigned in the decoder 32, phases selected by the decoder 32, and output logic in the second embodiment, by referring to FIG. 13.

First of all, the explanation about a case where the value "0" is assigned as the lower 4-bit data DL of the delay predetermined digital data. In this case, predetermining the lower 4-bit data value "0" causes the selector 52 to select the 0th phase output. Since both of the signals DL0 and DL3 input to the exclusive-OR circuit 53 are "0" in this case, the inversion control signal "e" to be output becomes "0". In addition, the 0th phase output is "1" at this time, so that the output logic results in non-inversion (FIG. 13(1)). The value "1", which is the 0th phase output from the selector 5, is further output from the exclusive-OR circuit 54 without inversion.

According to this embodiment, the value "1" is output as the 0th phase output of the ring oscillator 31 after the delay time of "t r0" (the amount of delay time including the delay time "t d1" of one inverter) elapses. Therefore, if "0" is assigned as the lower 4-bit data DL, the 0th phase with the amount of delay time "t r0" including the amount of delay time of one inverter is output without inversion.

Provided next is the explanation about a case where the value "1" is assigned as the lower 4-bit data DL of the delay predetermining digital value. In this case, the 1st phase output is selected by the selector 52. Since the signal input to the exclusive-OR circuit 53 is DL0 with the value "1" and DL3 with the value "0" at this time, the output from the exclusive-OR circuit 53 (inversion control signal "e") results in "1". In addition, the output logic results in "inversion" (as shown in FIG. 13(2)), and the 1st phase output from the selector 52 is inverted and output by the exclusive-OR circuit 54.

In this embodiment, the value "0" is output as the 1st phase output of the ring oscillator 31 after the amount of delay time "t d1" of one inverter elapses after the rising edge of the 0th phase output. Accordingly, if "1" is assigned as the lower 4-bit data DL, the first phase output delayed after the oscillation control signal "a" by the amount of delay time "t r0+t d1", is inverted and output.

If "2" is assigned as the lower 4-bit data DL of the delay predetermining digital value, the selector 52 selects the second phase output of the ring oscillator 31. Since both of the signals DL0 and DL3 input to the exclusive-OR circuit 53 are 0, the value of the inversion control signal "c" to be output becomes "0". At this time, the 2nd phase output is "1", and the output logic results in "non-inversion" (FIG. 13(3)). As a result, the value "1" of the 2nd phase output from the selector 52 is output from the exclusive-OR circuit 54 without inversion.

If "3" is assigned as the lower 4-bit data DL, the inversion control signal "e" becomes "1", and the 3rd phase output becomes "0". Accordingly, the output logic results in "inversion" (FIG. 13(4)). As a result, the 3rd phase value "0" output from the selector 52 is inverted and output from the exclusive-OR circuit 54.

Similarly and subsequently, each of the phase outputs from the ring oscillator 31 is output with/without inversion, and signals of the same phase are output in respective stages from the decoder 32.

Figure 14:
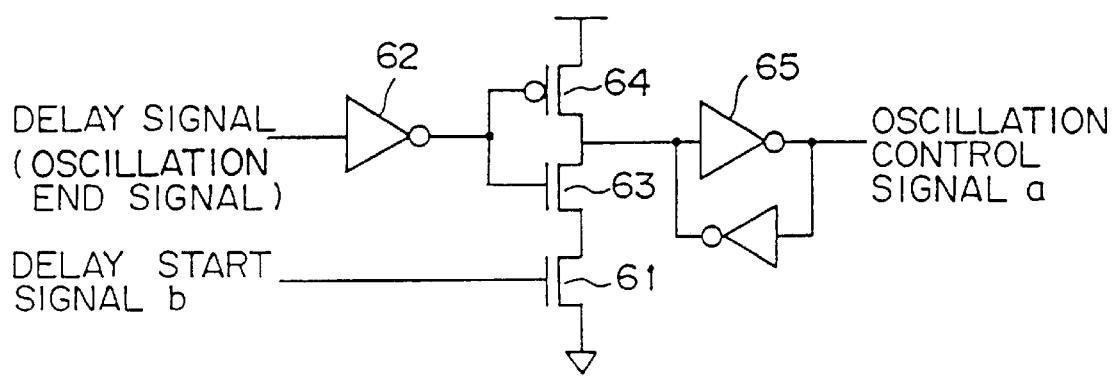
FIG. 14 shows a structure of a control circuit 34.

FIG. 14 shows an example of the control circuit 34. In this figure, if the delay start signal "b" is driven to "0", a transistor 61 is switched on. Since the delay signal is "0" at this time, it is inverted by the inverter 62 and supplied to gates of transistors 63 and 64. Then, the transistors 63 and 64 are switched on and off respectively, and the input to the inverter 65 is driven to "0". As a result, the oscillation control signal "a" is inverted to be "1".

When the delay signal is output from the delay circuit 30 after an elapse of a certain period of delay time after the oscillation control signal "a" goes to "0", the output of the inverter 62 results in "0". Then the transistor 64 is switched on and the input to the inverter 65 becomes "1". As a result, the oscillation control signal "a" is inverted to be "0".

By switching the oscillation control signal "a" between "0" and "1" as described above, the oscillation operations of the ring oscillator 31 are controlled.

Since one stage of the ring oscillator 31 is composed of inverters in this embodiment, the amount of each stage delay can be reduced, and the minimum step of delay that the delay circuit generates can be improved. If the minimum step of delay is not required to be small, a buffer composed of two serially connected inverters may be used to make the phase outputs in-phase, as described in the first embodiment.

Provided next is the explanation about a delay time measurement circuit for measuring a delay time between two types of signals, according to the third embodiment of the present invention. In this embodiment, one of the two signals to be measured is assumed to be a measurement start signal "c", and the other is assumed to be a Measurement end signal "d".

Figure 15:
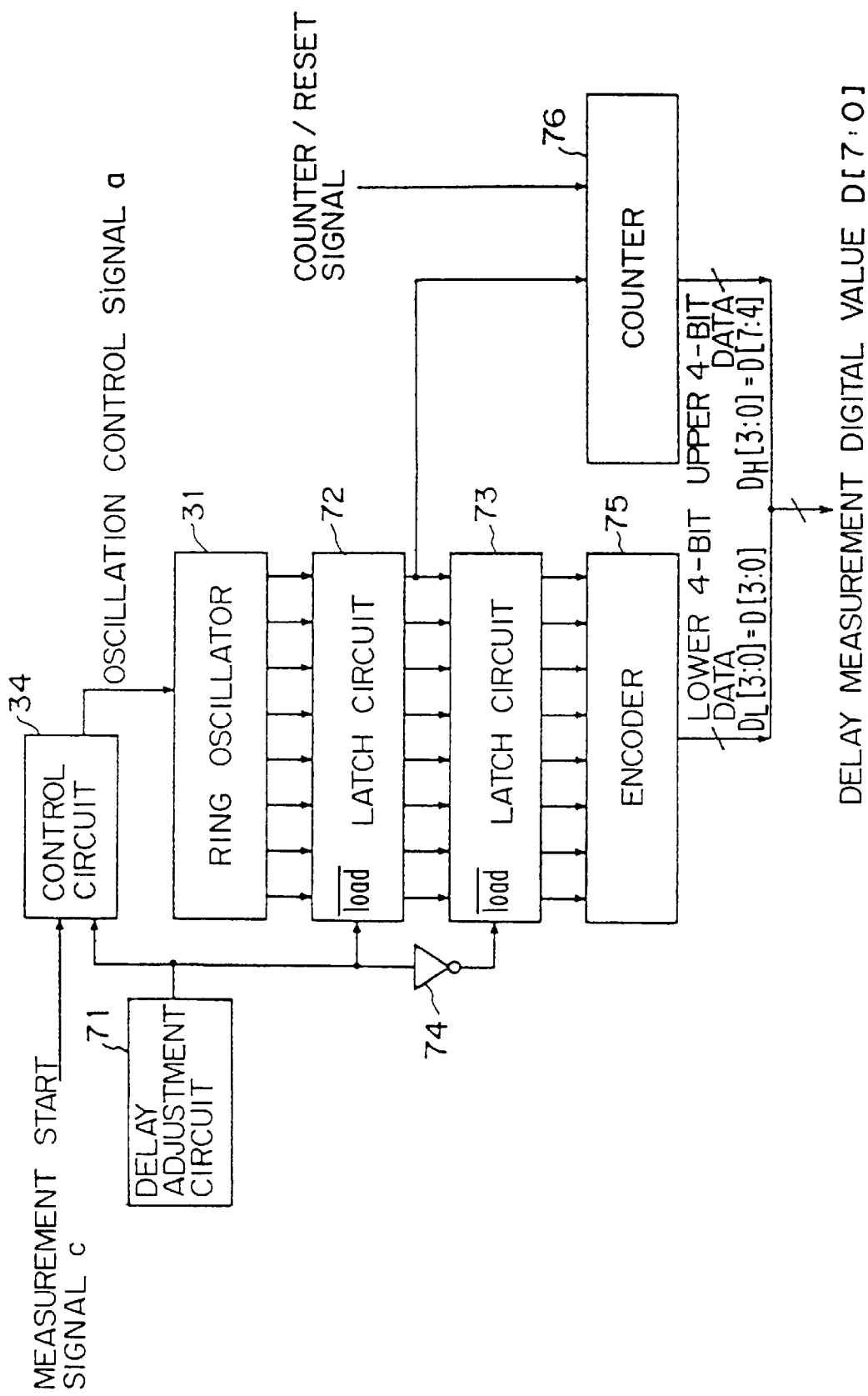
FIG. 15 is a block diagram showing a structure of a delay time measurement device according to the third embodiment.

In FIG. 15, the ring oscillator 31 is the same as that in the above described second embodiment, and a signal generated by inverting an output of a preceding phase is output as each phase of the ring oscillator 31.

Since the output of the ring oscillator 31 is delayed from the measurement end signal "d" due to a delay produced inside of the ring oscillator 31, a delay adjustment circuit 71 is used to output a signal delayed from the measurement end signal "d" by an amount of "t adjust" to the control circuit 34 and latch circuits 72 and 73, which will be described later, in order to adjust the produced delay.

The latch circuit 72 outputs input data unchanged if an output signal (load signal) of the delay adjustment circuit 71 supplied to a load terminal is LOW. If the load signal goes HIGH, the latch circuit 72 latches the input data.

The load terminal of the latch circuit 73 is supplied with a signal generated by inverting the output signal from the delay adjustment circuit 71 by the inverter 74. If the inverted signal is driven HIGH, the latch circuit 73 latches the output data from the latch circuit 72.

An encoder 75 encodes the output data from the latch circuit 73, that is, each of phase outputs from the ring oscillator 31, and outputs a value according to each of the phase outputs as the lower 4-bit data DL 3:0 included in the delay measurement digital value D 7:0.

A counter 76 performs a count operation in synchronization with a rising edge of the 7th phase output (the highest output) latched by the latch circuit 72, and outputs the count value as the upper 4-bit data DH 3:0 included in the delay measurement digital value D 7:0.

That is, the counter 76 counts the number of cycles of the ring oscillator 31, corresponding to an amount of delay time from the rising edge of the measurement start signal "c" till the rising edge of the output of the delay adjustment circuit 71, and the encoder 75 measures the number of stages of the ring oscillator 31 corresponding to the amount of delay time. By taking advantage of the output from the counter 76 as the upper 4-bit data DH 3:0, and the output from the encoder 75 as the lower 4-bit data DL 3:0, the amount of delay time between the two types of signals can be measured as a digital value. Additionally, since the ring oscillator 31 is employed as a circuit for measuring an amount of delay time, there is no need to arrange inverters required for the number of stages corresponding to an amount of delay time to be measured, thereby simplifying the configuration of the circuitry. In this case, the minimum duration that can be measured is the delay of one inverter.

FIG. 16 shows the correspondence between the input and output data of the encoder 75 in the third embodiment. If the 0th phase output of the ring oscillator 31 is "L" ("0"), the 1st phase output is "H" ("1"), and the subsequent phase outputs are "L" and "H" in turn, the encoder 75 outputs the value "0" as the lower 4-bit data DL (FIG. 16(1)).

If the 0th phase output only makes an "L-to-H" transition, the value "1" is output as the lower 4-bit data (FIG. 16(2)). If the 1st phase output makes a "H-to-L" transition after an elapse of one inverter delay of "t d1", the value "2" is output as the lower 4-bit data (FIG. 16(3)). Similarly, each time the one inverter delay of "t d1" elapses, a subsequent phase output is inverted, and 4-bit data according to the inverted phase output is output.

Figure 17:
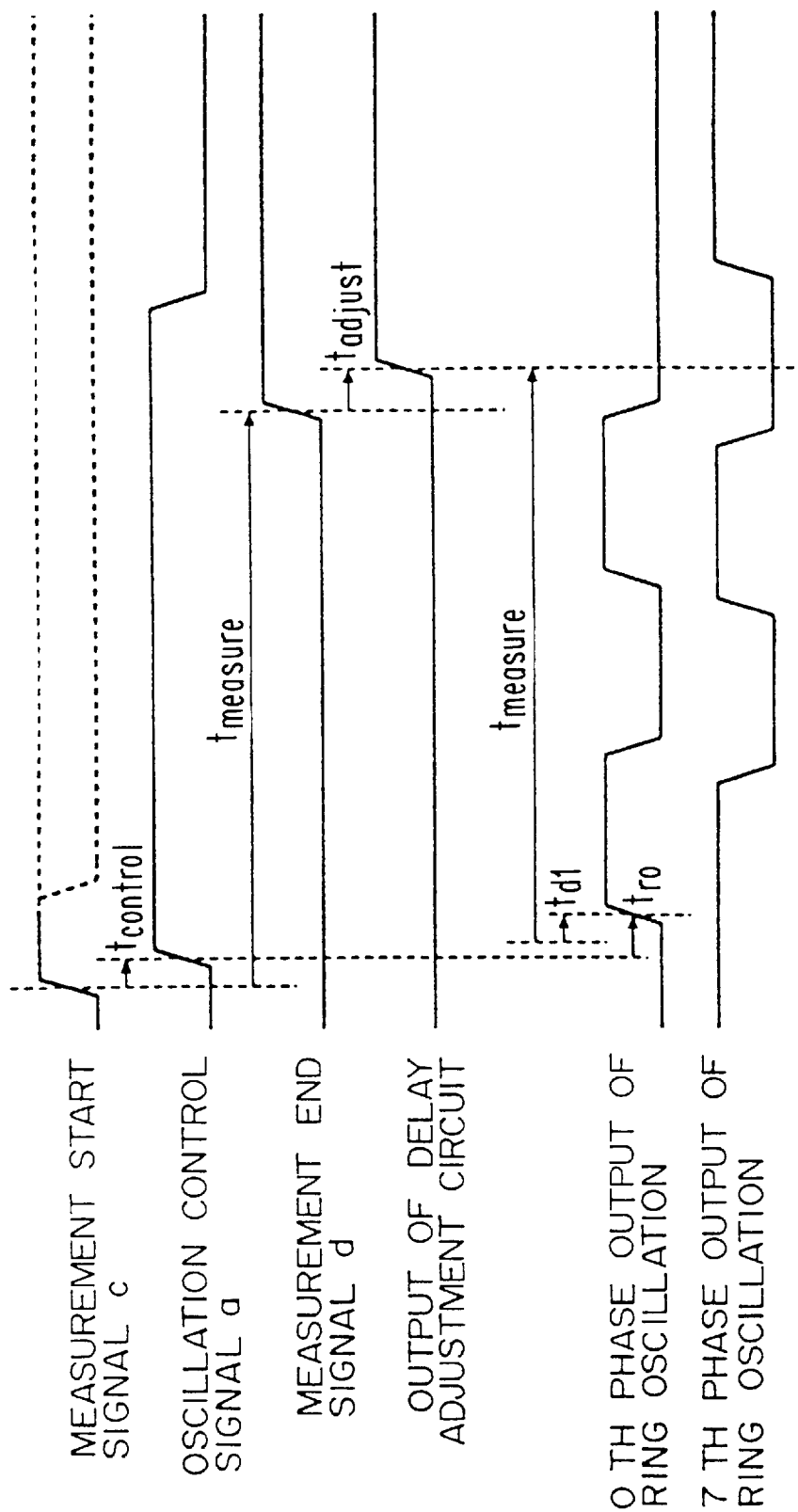
FIG. 17 shows a timing chart of the delay time measurement device according to the third embodiment.

Returning now to FIG. 15, the explanation about the operations of the delay time measurement device shown in FIG. 15 is provided below, by referring to the timing chart shown in FIG. 17. If the measurement start signal "c" goes HIGH, the oscillation control signal "a" is driven HIGH after an elapse of the delay time of "t control" within the control circuit 34. When the oscillation control signal "a" goes HIGH, the 0th phase output is driven HIGH after an elapse of the delay time of "t r0" within the ring oscillator.

Once a measurement of delay time is started, the counter 76 increments or decrements its value each time the 7th phase output goes HIGH. The duration until a signal generated by delaying the measurement end signal "d" by an amount of time "t adjust" goes HIGH, is measured as a delay time of the measurement end signal "d" from the measurement start signal "c".

To make a correspondence between the delay time "t measure" to be measured and a delay measurement digital value D output from the encoder 75 and the counter 76, a delay must be adjusted by the delay adjustment circuit 71, so that the delay time "t adjust" can be derived by the following equation:

$$t\ adjust = t\ control + t\ r0 - t\ d1$$

If the delay adjustment circuit 71 is not used, input phases to the counter 76 and the logic table of the encoder 75 shown in FIG. 16 must be modified.

In addition, either of the latch circuits 72 and 73 included in the delay time measurement device shown in FIG. 15 may be omitted, and the delay time measurement device may employ only one latch circuit 77 as shown in FIG. 18. Furthermore, the latch circuit can be embedded in the encoder 75.

The present invention is applicable not only 1u to a delay circuit or a delay time measurement circuit included in an LSI, but also to other circuits.

The present invention can implement a delay device that can generate a larger amount of delay time though its circuitry is smaller than that of a conventional device. Additionally, taking advantage of a ring oscillator enables a delay time measurement device with circuitry smaller than that of the conventional device, and at the same time enables a measurement of an amount of delay time by a digital value. Connecting a plurality of inverters to one of inputs of a selector in an exclusive-OR circuit can eliminate a difference of delay time between an inverted output and a non-inverted output.

What is claimed is:

1. A delay time measurement device for measuring an amount of delay time between a first and a second signal, comprising:

a controller for outputting a control signal based on the said first signal;

a ring oscillator for outputting a plurality of phases in response to said control signal;

an encoder for latching an output from said ring oscillator in synchronization with the second signal for outputting a latched signal and encoding said latched signal; and a counter for counting an output from said encoder, wherein:

the amount of delay time between the first signal and the second signal is obtained according to an output from said encoder and an output from said counter.

2. The delay time measurement device according to claim 1, wherein:

said encoder outputs a result of encoding said latched signal as a lower data of the amount of delay time between the first signal and the second signal; and said counter outputs a count result as an upper data of the amount of delay time between the first signal and the second signal.

3. A delay time measurement device for measuring an amount of delay time between a first signal and a second signal, comprising:

a controller for outputting a control signal based on the said first signal;

a ring oscillator for outputting a plurality of phases in response to said control signal;

a latch circuit for latching an output from said ring oscillator in synchronization with the second signal;

an encoder for encoding an output from said latch circuit and outputting an encoded result as a lower data of the amount of delay time between the first signal and the second signal; and a counter for counting an output from said latch circuit and outputting a count result as an upper data of the amount of delay time between the first signal and the second signal.

4. The delay time measurement device according to claim 1, wherein said ring oscillator is composed of a plurality of serially connected inverters, and one stage of said ring oscillator is composed of one stage of inverters.

5. The delay time measurement device according to claim 3, wherein:

said encoder outputs an amount of delay time of the second signal delayed from the first signal by within one cycle of said ring oscillator, as the lower data; and said counter outputs an integer multiple of one cycle delay of said ring oscillator, as the upper data.

6. A delay time measurement device for measuring an amount of delay time between a first signal and a second signal, comprising:

a ring oscillator for outputting a plurality of phases in response to said first signal;

a delay adjustment circuit for providing a third signal obtained by delaying said second signal by a predetermined time to compensate for a delay occurring in said delay time measurement device;

an encoder for latching an output from said ring oscillator in synchronization with said third signal for outputting a latched signal and encoding said latched signal; and a counter for counting an output from said encoder, wherein:

the amount of delay time between said first signal and said second signal is obtained according to an output from said encoder and an output from said counter.

* * * * *